(12) United States Patent
Dow

(10) Patent No.: US 6,934,163 B2
(45) Date of Patent: *Aug. 23, 2005

(54) CAPACITOR FOR DRAM CONNECTOR

(75) Inventor: Keith Dow, Folson, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/194,530

(22) Filed: Jul. 12, 2002

(65) Prior Publication Data

US 2002/0176237 A1 Nov. 28, 2002

Related U.S. Application Data

(63) Continuation of application No. 09/596,037, filed on Jun. 15, 2000, now Pat. No. 6,445,590.

(51) Int. Cl.⁷ .............................................. H01R 12/16
(52) U.S. Cl. ...................... 361/785; 361/788; 361/803; 361/778; 439/62
(58) Field of Search ..................... 361/760, 772–774, 361/785, 788, 803, 778, 791; 439/61–62, 630, 148

(56) References Cited

U.S. PATENT DOCUMENTS

| | | | | |
|---|---|---|---|---|
| 4,807,036 A | * | 2/1989 | Osada et al. | 348/736 |
| 4,946,403 A | | 8/1990 | Billman et al. | |
| 5,543,661 A | * | 8/1996 | Sumida | 257/707 |
| 5,590,030 A | | 12/1996 | Kametani et al. | |
| 5,853,303 A | * | 12/1998 | Brunker et al. | 439/637 |
| 5,980,282 A | | 11/1999 | Ching | |
| 6,095,821 A | | 8/2000 | Panella et al. | |
| 6,204,559 B1 | | 3/2001 | Lin et al. | |
| 6,301,104 B1 | * | 10/2001 | Hu | 361/684 |
| 6,445,590 B1 | * | 9/2002 | Dow | 361/760 |
| 6,542,373 B1 | * | 4/2003 | Oba | 361/760 |

* cited by examiner

Primary Examiner—Amir Zarabian
Assistant Examiner—Thanh Y. Tran
(74) Attorney, Agent, or Firm—Blakely, Sokoloff, Taylor & Zafman LLP

(57) ABSTRACT

In one embodiment, a dummy via is created in a circuit board. The dummy via is positioned and coupled to a portion of a transmission line. This portion of the transmission line is further coupled to a signal lead of a connector, which creates additional capacitance to lower the impedance of the connector.

20 Claims, 3 Drawing Sheets

CAPACITOR FOR DRAM CONNECTOR

This application is a continuation of U.S. patent application Ser. No. 09/596,037, filed Jun. 15, 2000, which has now matured to U.S. Pat. No. 6,445,590.

FIELD OF THE INVENTION

The present invention relates to the field of connectors.

BACKGROUND OF THE INVENTION

For many years, electronic systems have been designed to include a circuit board featuring one or more transmission lines. The transmission lines are routed either on its surface or integrated between selectively patterned insulation and metal layers of the circuit board. Connectors are placed on the surface of the circuit board and are appropriately connected to various transmission lines that provide signaling and power as needed.

In certain embodiments, the impedance of the connector may be unacceptably high, which may distort signals transmitted through the connector. Normally, tab capacitors can be employed to increase the capacitance of the connector and appropriately reduce the impedance of the connector. A "tab capacitor" is formed by adding additional metal to a signal line within the routing layer that is coupled to ground. Unfortunately, tab capacitors are not cost-effective and require a large amount of circuit board area.

BRIEF DESCRIPTION OF THE DRAWINGS

The features and advantages of the present invention will become apparent from the following detailed description of the present invention in which.

DETAILED DESCRIPTION OF THE INVENTION

Herein, embodiments for a circuit board and method for reducing signal distortion caused by unacceptably high connector impedance is shown. While numerous details are set forth to ensure understanding of the present invention, it is apparent to one skilled in the art that these specific details may not be required to practice the present invention.

Certain terminology is frequently used to describe certain packaging hardware and characteristics. For example, an "electronic system" is broadly defined as any hardware product featuring circuit boards connected by at least one connector. Examples of an electronic system includes a computer (e.g., desktop, laptop, hand-held, server, etc.), wireless communication device (e.g., cellular phones, cordless phones, pagers, etc.), a computer-related peripheral (e.g., printer, scanner, etc.) and the like. A "circuit board" is a substrate including insulate and conductive layers that collectively support the propagation of signals from or to devices on the circuit board. Certain types of circuit boards may include, but are not limited or restricted to the following: motherboards, memory modules, token cards (e.g., PCMCIA card), network boards the like.

In addition, the "conductive layer" of a circuit board includes one or more transmission lines which are broadly defined as any medium capable of propagating information and/or various levels of power (e.g., ground, 3.3V, 5V, etc.). Examples of transmission lines normally include a board trace made of conductive material (e.g., metal). However, other forms of transmission lines may be used such as electrical wire routed loosely or placed in a protective sheath, optical fiber, a wireless transmitter/receiver combination, and the like.

Figure 1:
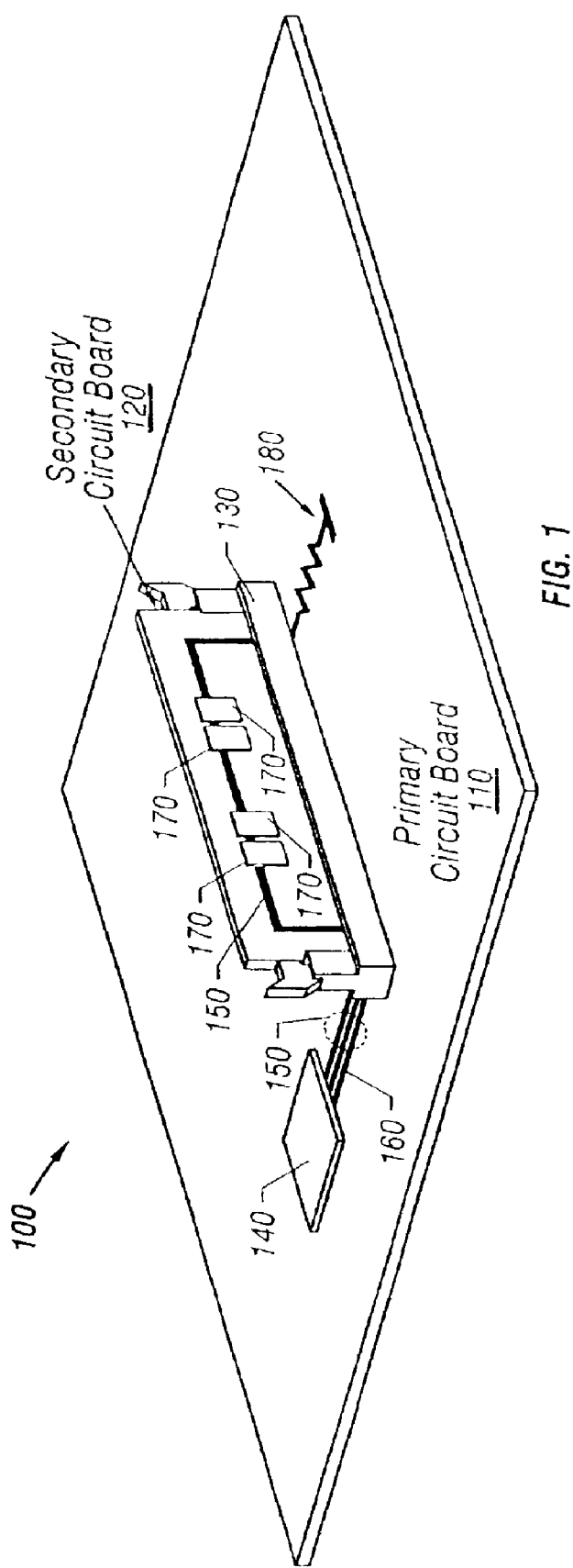
FIG. 1 is an illustrative embodiment of an electronic system including a connector interconnecting electronic devices of a first circuit board to a second circuit board.

Referring to FIG. 1, an illustrative embodiment of an electronic system featuring an embodiment of the present invention is shown. The electronic system 100 includes a primary circuit board 110 and at least one secondary circuit board 120 coupled to the primary circuit board 110 via a connector 130. All boards 110 and 120 and connector 130 are enclosed within a chassis (not shown) such as a computer casing for example. In this embodiment, the primary circuit board 10 includes a component 140 (e.g., a processor, application specific integrated circuit, microcontroller, memory controller, etc.) in communications with the connector 130 over a communication path 150. The communication path 150 is established by one or more terminated, transmission lines 160.

As shown, in one embodiment, the connector 130 is a RAMBUS® RIMM™ connector, which is a single piece contact assembly designed to provide an interface for the second circuit board 120. The second circuit board 120 may include either (1) a high-speed RAMBUS® RIMM™ memory module including memory devices 170 designed by Rambus, Inc. of Mountain View, Calif., or (2) a RIMM™ continuity module (not shown). The RIMM™ continuity module occupies a connector and does not route signals to any memory components. Instead, it merely ensures that the signals over communication path 150 flow continuously from the component 140 to terminating resistors 180 for the transmission lines 160.

Alternatively, for another embodiment, it is contemplated that that the connector 130 may be used as an edge connector for any type of circuit board besides RIMM™ connectors as shown above. Likewise, for yet another alternative embodiment, the connector 130 may even constitute a socket for an electronic component (e.g., a packaged integrated circuit device).

Figure 2A:
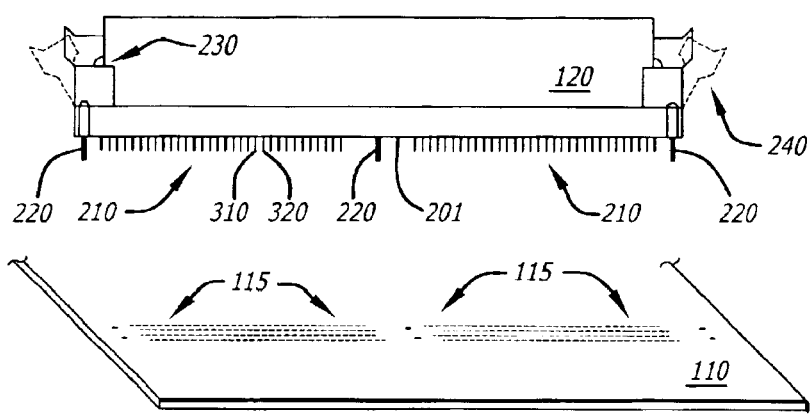
FIGS. 2A and 2B are illustrative embodiments of the connector of FIG. 1.
Figure 2B:
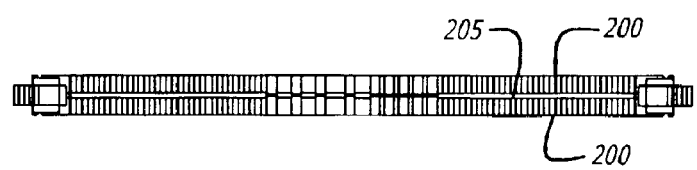

As shown in FIGS. 2A and 2B, an illustrative embodiments of the connector 130 is shown. The connector 130 features a form factor similar to a Dual In-Line Memory Module (DIMM) connector used with conventional direct read access memory (DRAM) components. In this embodiment, the connector 130 is sized to range between five and seven inches in length to fit approximately within the same board area as the footprint for the DIMM connector. It is contemplated, however, that any connector size may be used.

Made of a thermal resistant material (e.g., thermoplastic) designed to withstand a reflow soldering process, the connector 130 includes contacts 200 on opposite sides of a slot 205. The contacts 200 are spring loaded fingers made of a conductive material such as copper beryllium. The slot 205 is sized to establish a mechanical and electrical connection with a circuit board such as a RIMM™ memory module or a RIMM™ continuity module as shown in FIG. 1. The opposing contacts 200 are configured to route signals to a plurality of leads 210 of the connector 130, which protrude from a bottom side 201 of the connector 130. The leads 210, shown as pins for this illustrative embodiment, are inserted through pre-cut apertures 115 in the primary circuit board 110. These apertures 115 constitute the footprint for the connector 130. The leads 210 are fastened, normally with solder, to the primary circuit board 110 during assembly and establish connections with the transmission lines 160 of FIG. 1.

As further shown in FIG. 2, a plurality of posts 220 are inserted through apertures of the footprint for firmly securing the connector 130 to the primary circuit board 110. For this embodiment, the posts 220 are situated proximate to the ends of the connector 130 and generally near a center of the connector 130.

The connector 130 further comprises a pair of extractors 230 and 240, which are located at opposite ends of the connector 130. In this embodiment, the extractors 230 and 240 are levers that adjust the width of the slot 205 by moving the opposing contacts 200 closer together or further apart.

More specifically, when the connector 130 is placed in a locked position as shown in FIG. 2A, the opposing contacts 200 are positioned in closer proximity to one another. Hence, an edge connector of the secondary circuit board 120 is mechanically fastened and electrically connected to the connector 130. This establishes an electrical coupling between selected transmission lines of the primary circuit board 110 with certain transmission lines of the secondary circuit board 120. Thus, electronic devices situated on the secondary circuit board 120 are able to communicate with electronic device situated on the primary circuit board 110.

As shown by dashed lines in FIG. 2A, when the extractors 230 and 240 are placed in an unlocked position, the opposing contacts 200 are positioned at a greater distance from one another. This allows the secondary circuit board 120 to be easily removed from the connector 130.

Figure 3:
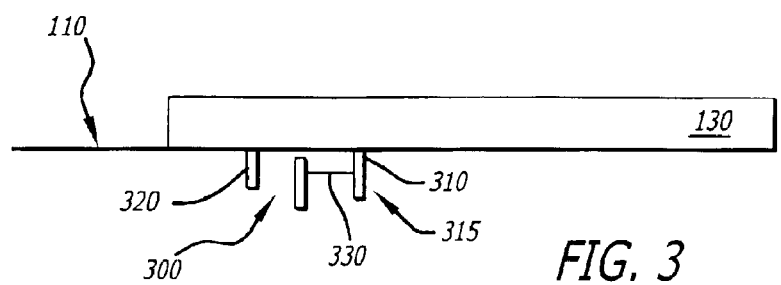
FIG. 3 is an illustrative embodiment of the prospective view of the connector employing a dummy via to create a connector capacitor to reduce signal distortion.

Referring to FIG. 3, an illustrative embodiment of the prospective view of the formation of a connector capacitor for the connector 130 is shown. To add capacitance to the connector 130, a dummy via 300 is created in the primary circuit board 110 between a signal lead 310 of the connector 130 and a neighboring ground lead 320. Thereafter, the dummy via 300 is coupled to the signal lead 310. For one embodiment, this coupling is provided by a portion of a transmission line 330. The transmission line 330 is coupled approximately at the middle 315 of the signal lead 310 (referred to as the "near mid-point") to further mitigate inductance and avoid signal distortion (e.g., crosstalk, ringing, etc.).

Figure 4:
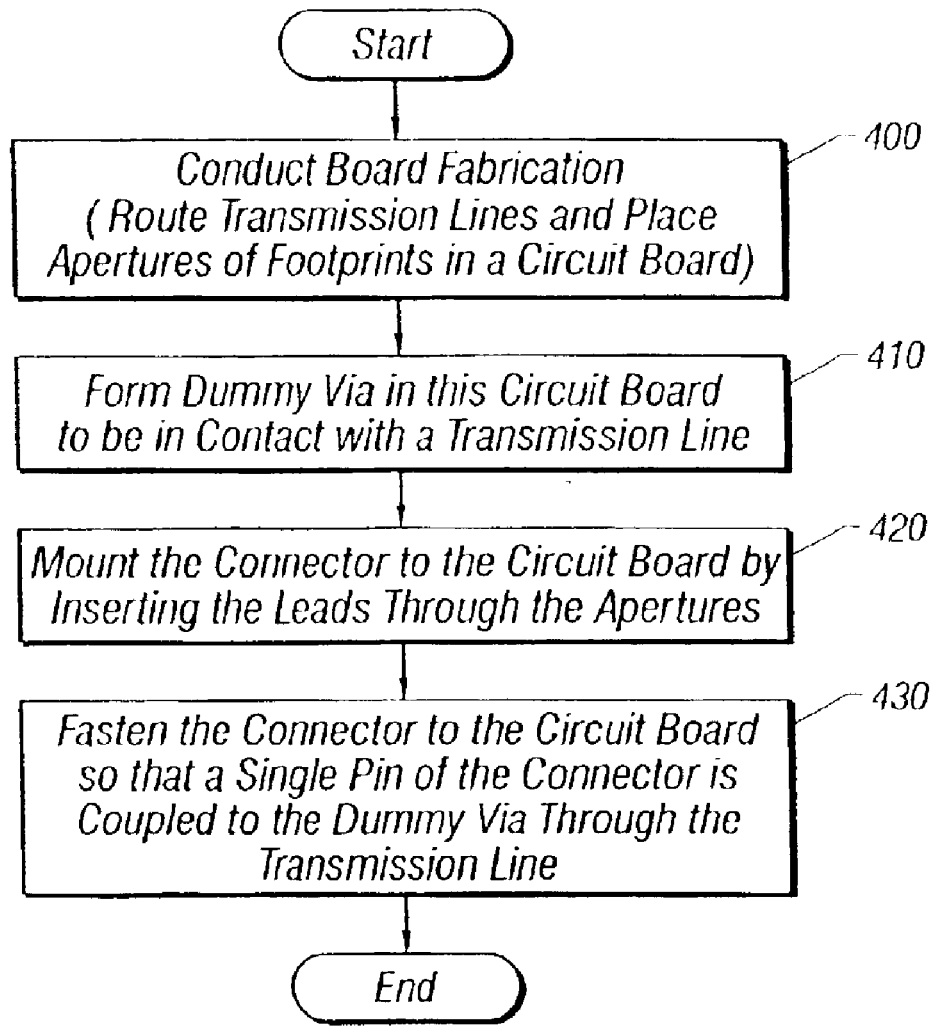
FIG. 4 is an illustrative flowchart of the operations to produce a circuit board including the connector capacitor.

Referring now to FIG. 4, an illustrative flowchart of the operations performed to produce a circuit board including the connector capacitor is shown. Initially, the transmission lines are placed within circuit board during board fabrication along with apertures forming footprints for electronic devices (step 400). A selected aperture is in close proximity with a transmission line and thus, coupled to a signal lead where the connector is mounted to the circuit boards. Prior to placement of the connector on to the circuit board, the dummy via is formed in the circuit board and is filled with a conductive material. The dummy via is in contact with the transmission line in close proximity to the selected aperture (block 410). Upon placement of a connector onto the circuit board, the leads of the connector are soldered to a plurality of transmission lines, including the transmission line coupled to the dummy via (blocks 420 and 430). This creates the connector capacitor so that the additional capacitance reduces the impedance of the connector.

The present invention described herein may be designed in accordance with many different configurations. While the present invention has been described in terms of various embodiments, other embodiments may come to mind to those skilled in the art without departing from the spirit and scope of the present invention. The invention should, therefore, be measured in terms of the claims which follow.

What is claimed is:

1. An apparatus comprising:
   a circuit beard having a footprint, the footprint including an aperture to receive a signal lead of a connector and a neighboring aperture to receive a ground lead of the connector; and
   a dummy via formed in the circuit board between the aperture and the neighboring aperture and including a conductive material, the dummy via being coupled to the signal lead of the connector by a transmission line when a plurality of leads of the connector are inserted through the footprint.

2. The apparatus of claim 1, wherein the dummy via is coupled to a near mid-point of the signal lead.

3. The apparatus of claim 1, wherein the footprint further comprises a plurality of additional apertures, the plurality of additional apertures including a first plurality of apertures aligned along a first plane and a second plurality of apertures that correspond to the first plurality of apertures and are aligned along a second plane in parallel with the first plane.

4. The apparatus of claim 1, wherein the dummy via is a capacitor to add capacitance to the connector or mitigate inductance.

5. The apparatus of claim 1, wherein the dummy via is a capacitor to mitigate signal distortion.

6. The apparatus of claim 1, wherein the aperture, dummy via, and neighboring aperture are linearly arranged.

7. A system comprising:
   a circuit board having a plurality of apertures associated with a component footprint, a dummy via filled with conductive material and a transmission line coupled to the dummy via; and
   a connector attached to the circuit board, the connector including a plurality of leads for insertion through the plurality of apertures, the plurality of leads including a ground lead that is inserted through a first aperture of the plurality of apertures and a signal lead that is inserted through a second aperture of the plurality of apertures and coupled to the at least one transmission line.

8. The system of claim 7, wherein the circuit board is a memory module.

9. The system of claim 7, wherein the at least one transmission line is coupled to a near mid-point of the signal lead.

10. The system of claim 7, wherein the dummy via is a capacitor to add capacitance to the connector and to mitigate signal distortion.

11. The system of claim 7, wherein the dummy via is a capacitor to mitigate inductance.

12. The system of claim 7, wherein the aperture, dummy via, and neighboring aperture are linearly arranged.

13. A method comprising:
   implementing a dummy via within a circuit board the dummy via filled with a conductive material; and
   coupling the dummy via to a signal lead of a connector via a transmission line when the signal lead of the connector is inserted into a first aperture of the circuit board, the dummy via disposed between the signal lead and a ground lead of the connector when the connector is attached to the circuit board.

14. The method of claim 13, wherein the coupling of the dummy via to the signal lead include attaching a portion of the transmission line to a near mid-point of the signal lead.

15. The method of claim 13, wherein prior to coupling of the dummy via signal to the signal lead, the method further comprises positioning a portion of the transmission line within the circuit board so that a first end of a portion of the transmission line is coupled to the dummy via and a second end of the portion of the transmission line is coupled to the signal lead when the connector is attached to the circuit board.

16. The method of claim 13, wherein prior to implementing the dummy via, the method comprises:

fabricating the circuit board to include the transmission line and a plurality of apertures to receive leads of the connector including the first aperture.

17. The method of claim 13, wherein the signal lead, the ground lead, and the dummy via are linearly positioned.

18. The method of claim 13, wherein the dummy via is a capacitor to mitigate signal distortion.

19. The method of claim 13, wherein the dummy via is a capacitor to add capacitance to the connector.

20. The method of claim 13, wherein the dummy via is a capacitor to mitigate inductance.

* * * * *